US009510487B2

(12) United States Patent
Horiuchi et al.

(10) Patent No.: US 9,510,487 B2
(45) Date of Patent: Nov. 29, 2016

(54) POWER CONVERSION APPARATUS

(71) Applicant: Hitachi Automotive Systems, Ltd., Hitachinaka-shi, Ibaraki (JP)

(72) Inventors: Keisuke Horiuchi, Tokyo (JP); Atsuo Nishihara, Tokyo (JP); Kinya Nakatsu, Tokyo (JP); Morio Kuwano, Hitachinaka (JP); Yosei Hara, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 100 days.

(21) Appl. No.: 14/422,381

(22) PCT Filed: Jul. 24, 2013

(86) PCT No.: PCT/JP2013/069972
§ 371 (c)(1),
(2) Date: Feb. 19, 2015

(87) PCT Pub. No.: WO2014/050277
PCT Pub. Date: Apr. 3, 2014

(65) Prior Publication Data
US 2015/0223366 A1    Aug. 6, 2015

(30) Foreign Application Priority Data

Sep. 28, 2012 (JP) ................................. 2012-215457

(51) Int. Cl.
*H05K 7/20*        (2006.01)
*H02M 7/00*       (2006.01)

(52) U.S. Cl.
CPC ........... *H05K 7/2089* (2013.01); *H02M 7/003* (2013.01); *H05K 7/20254* (2013.01); *H05K 7/20927* (2013.01)

(58) Field of Classification Search
CPC ........... H05K 7/2089; H05K 7/20254; H05K 7/20927; H02M 7/003
See application file for complete search history.

(56) References Cited

U.S. PATENT DOCUMENTS 7,710,721 B2 * 5/2010 Matsuo ................. H01L 23/473
165/104.33
8,094,454 B2    1/2012 Lowry
(Continued)

FOREIGN PATENT DOCUMENTS

JP     2004-119667 A    4/2004
JP     2006-202899 A    8/2006
(Continued)

OTHER PUBLICATIONS

International Search Report (PCT/ISA/210) dated Nov. 5, 2013, with English translation (Four (4) pages).

*Primary Examiner* — Adam B Dravininkas
(74) *Attorney, Agent, or Firm* — Crowell & Moring LLP

(57) ABSTRACT

A power conversion apparatus includes: a power semiconductor module (150*a*); a flow channel forming body (20) for housing the power semiconductor module (150*a*); and a cover (5) for fixing the power semiconductor module (150*a*) to the flow channel forming body (20), and the power semiconductor module (150*a*) includes a power semiconductor element, main terminals (157*b*, 158*b*) electrically connected to the power semiconductor element, and a case for housing the power semiconductor element, the cover (5) has a recessed portion (5*c*) and an opening (5*a*) provided in a bottom surface portion of the recessed portion (5*c*), the power semiconductor module (150*a*) is placed to be fitted into the recessed portion (5*c*), the power semiconductor module (150*a*) is fixed to the cover (5) so that the main terminals (157*b*, 158*b*) pass through the opening (5*a*), the case and an inner wall of the recessed portion (5*c*) have an airtight structure, and therefore prevents intrusion of a coolant into the power semiconductor module having a double-sided cooling structure and outflow of the coolant to outside of the module.

7 Claims, 9 Drawing Sheets

(56) References Cited

U.S. PATENT DOCUMENTS

| | | | |
|---|---|---|---|
| 2003/0133267 A1* | 7/2003 | Beihoff | B60L 11/12 361/704 |
| 2003/0173839 A1* | 9/2003 | Torii | H02K 11/33 310/52 |
| 2004/0061138 A1 | 4/2004 | Shinohara et al. | |
| 2006/0096299 A1* | 5/2006 | Mamitsu | H01L 23/473 62/3.2 |
| 2008/0117602 A1* | 5/2008 | Korich | H01G 2/08 361/715 |
| 2009/0040724 A1* | 2/2009 | Nishikimi | H05K 7/20927 361/699 |
| 2009/0231811 A1* | 9/2009 | Tokuyama | H01L 23/36 361/699 |
| 2010/0025126 A1* | 2/2010 | Nakatsu | B60L 11/00 180/65.1 |
| 2011/0299265 A1 | 12/2011 | Nakatsu et al. | |
| 2011/0310585 A1* | 12/2011 | Suwa | H05K 7/2089 361/820 |

FOREIGN PATENT DOCUMENTS

| | | |
|---|---|---|
| JP | 2010-110143 A | 5/2010 |
| JP | 2011-216754 A | 10/2011 |

\* cited by examiner (a) CONVENTIONAL ART 1

(a') PROBLEM OF ART 1

(b') PROBLEM OF ART 2

(c') PROBLEM OF ART 3

(a) PERSPECTIVE VIEW OF POWER SEMICONDUCTOR MODULE (b) D-D' SECTIONAL VIEW (a) PERSPECTIVE VIEW OF SET OF
    CONSTITUENT MEMBERS OF FLOW CHANNEL (b) A-A' SECTIONAL VIEW (c) B-B' SECTIONAL VIEW

POWER CONVERSION APPARATUS

TECHNICAL FIELD

The present invention relates to a power conversion apparatus.

BACKGROUND ART

In electric vehicles or hybrid electric vehicles, it is important to reduce sizes and costs of parts to be provided. A power conversion apparatus for converting a direct current of a battery into an alternating current of a motor is no exception and reduction in size and costs thereof is demanded. As a result, a heat density becomes large, and therefore it is necessary to improve coolability.

Among electronic parts constituting the power conversion apparatus, an electronic part having the largest heating value is a power semiconductor module. In order to improve coolability of the power semiconductor module, a double-sided cooling structure (PTLs 1 to 3) in which grease having a large thermal resistance is not used and heat is radiated from both sides of a semiconductor element is effective.

CITATION LIST

Patent Literature

PTL 1: U.S. Pat. No. 8,094,454-B2
PTL 2: JP-A-2010-110143
PTL 3: JP-A-2006-202899

SUMMARY OF INVENTION

Technical Problem

However, in order to integrate heat sinks with a power semiconductor module so as not to use grease and further in order to provide the heat sinks on both sides thereof, there are two problems in sealing. One problem is intrusion of a coolant into a module, and the other problem is outflow of the coolant to outside of the module.

PTL 1 above discloses a structure that joins completely separated two heat sinks only with the use of a resin mold, and there is a problem in intrusion of a coolant into inner resin through a gap between two heat sinks. Resin material allows the coolant to pass to an element because of its polymer structure, and therefore it is difficult to use a conductive coolant such as ethylene glycol and propylene glycol. Even in a case where an insulating oil and an inert coolant are used, there is a problem in that strength of a joined part is reduced when resin is expanded/changed.

Sealing structures to prevent outflow of a coolant to outside of a module in PTLs 1 to 3 above have respective problems. FIG. 1 illustrates sectional views schematically illustrating sealing structures of the conventional arts described in PTLs 1 to 3. FIG. 1 (a) illustrates a structure corresponding to PTL 1, and achieves high sealing by interposing a semiconductor element 10 between two heat sinks (3a, 3b), inserting a power semiconductor module including a ring-like member 2 for holding the whole heat sinks into an opening of a housing 4 constituting a flow channel, and fixing a first cover 5 and a second cover 6 via sealing material 1 in the heat sink 3. FIG. 1 (b) illustrates a structure corresponding to PTL 2, which is structured to integrate horizontally provided heat sinks (7a, 7b) and to prevent intrusion of a coolant into the semiconductor element 10, and achieves high sealing by inserting sealing material between a lower surface of an integrated flange portion 7c and the housing 4. FIG. 1 (c) illustrates a structure corresponding to PTL 3, and achieves high sealing by inserting sealing material between an upper surface of the integrated flange portion 7c and the cover 5.

Note that, in the structure of FIG. 1 (a), a plurality of power semiconductor modules are arrayed in series in a depth direction of the sheet, and therefore all of the publicly-known techniques are supposed to seal a plurality of power semiconductor modules. In a case where the plurality of power semiconductor modules are sealed, there are some problems because of production variation of the power semiconductor modules. FIG. 1(a') illustrates a case where a size in a vertical direction of only one particular power semiconductor module is small, there is a possibility that fluid leakage indicated by an arrow 11 occurs. FIG. 1 (b') illustrates a case where a size in a vertical direction of only one central power semiconductor module is small. In FIG. 1(b'), there is a possibility that bypass flow occurs not only in the vicinity of the heat sinks in which the bypass flow should be originally flown to perform cooling but also in a lower part of the power semiconductor module and coolability is deteriorated. Further, because the flange portion 7c is large, there is a problem in reduction in size in a case where a plurality of power semiconductor modules are provided in parallel. FIG. 1 (c') illustrates a case where a size in a vertical direction of only one central module is small. In FIG. 1(c'), bypass flow indicated by an arrow 13 occurs, and there is a problem in that coolability of the power semiconductor module is not satisfactorily exerted.

All of the publicly-known examples obtain sealing reliability by performing sealing with a method such as bolt fastening or welding and pressing sealing material, and therefore a pressing force applied to the sealing material is important. Therefore, in a case of bolt fastening, there are problems in that a periphery of a bolt in an immediate vicinity of the power semiconductor module interferes the flow channel and assemblability is unsatisfactory because the number of bolts needed is increased. In a case of welding instead of bolt fastening, there is a problem in that a structure is complicated/enlarged to reduce damages to the power semiconductor module because of welding heat.

Solution to Problem

A power conversion apparatus according to the invention is applied as a power conversion apparatus for converting direct-current power into alternating-current power and converting alternating-current power into direct-current power with a switching operation of a semiconductor element. The power conversion apparatus include: a power semiconductor module including a power semiconductor element, a conductor plate for transmitting a direct current, main terminals electrically connected to the conductor plate, and a case for housing the power semiconductor element and the conductor plate; a flow channel forming body for housing the power semiconductor module; and a cover for fixing the power semiconductor module, and the cover has a recessed portion and an opening provided in a bottom surface portion of the recessed portion, the case has a through hole through which the main terminals pass, the case is fixed to the recessed portion so that the through hole faces to the opening, and a side wall of the case and a side wall of the recessed portion have an airtight structure.

Advantageous Effects of the Invention

According to the invention, it is possible to prevent intrusion of a coolant into a power semiconductor module having a double-sided cooling structure and prevent outflow of the coolant to outside of the module, and therefore both high coolability and high airtightness can be achieved.

DESCRIPTION OF EMBODIMENT

Figure 2:
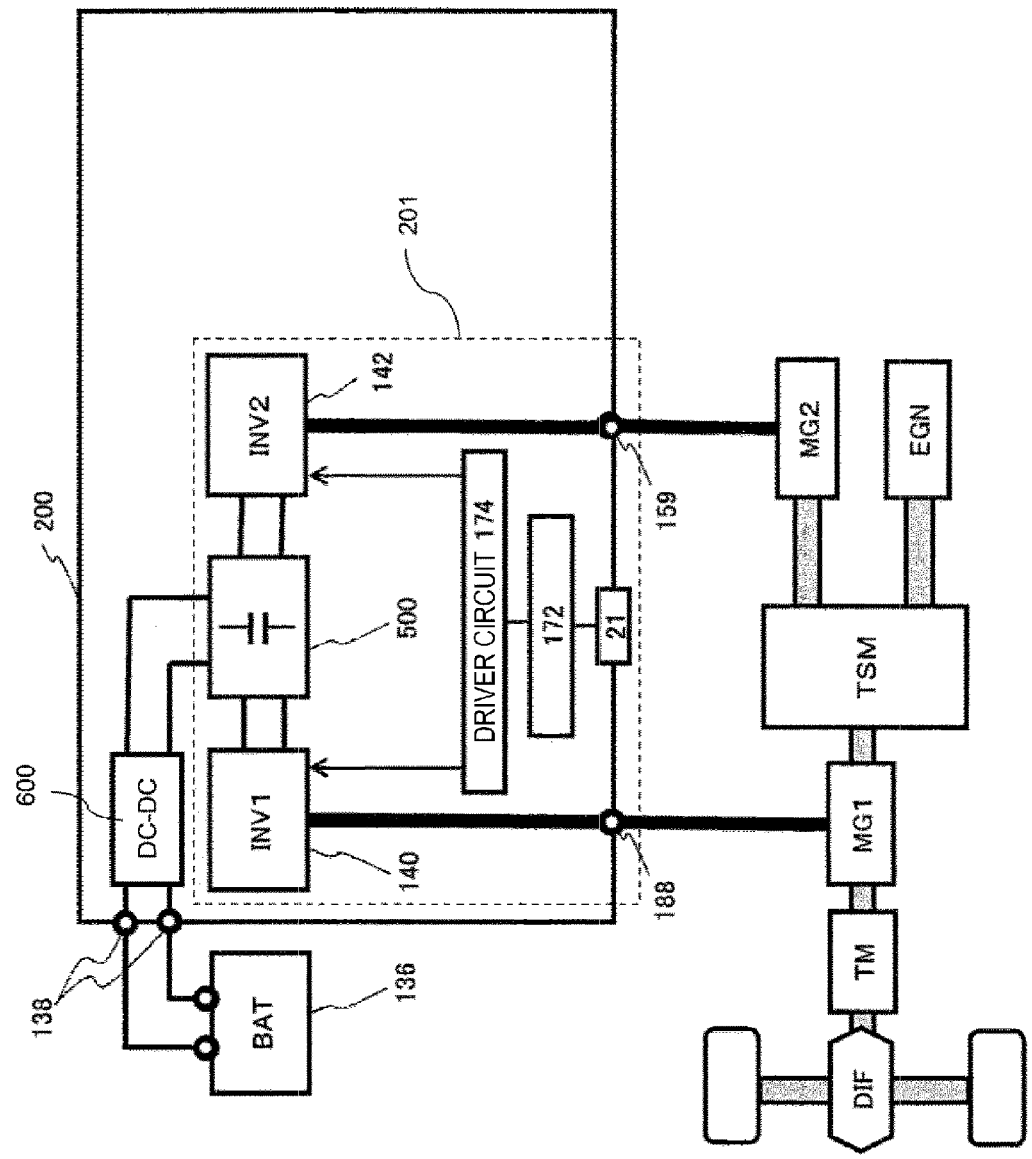
FIG. 2 shows a control block of a hybrid electric vehicle.

Hereinafter, an embodiment for implementing the invention will be described with reference to drawings. FIG. 2 shows a control block of a hybrid electric vehicle (hereinafter, referred to as "HEV"). An engine EGN, a motor generator MG1, and a motor generator MG2 generate torque for travelling the vehicle. The motor generator MG1 and the motor generator MG2 not only generate rotational torque but also have a function for converting mechanical energy applied to the motor generator MG1 and the motor generator MG2 from outside into electric power.

The motor generators MG1 and MG2 are, for example, synchronous machines or induction machines and operate as motors and also as power generators depending on an operation method as described above. In a case where the motor generators MG1 and MG2 are provided in an automobile, it is desired to produce a high output with a small size, and a permanent magnet type synchronous motor including a magnet such as neodymium is suitable. Generation of heat in a rotor of the permanent magnet type synchronous motor is smaller than that of an induction motor, and, also in terms of this point, the permanent magnet type synchronous motor is excellent as a synchronous machine for an automobile.

Output torque from an output side of the engine EGN and the motor generator MG2 is transmitted to the motor generator MG1 via a power distribution mechanism TSM, and rotational torque from the power distribution mechanism TSM or rotational torque generated by the motor generator MG1 is transmitted to wheels via a transmission TM and a differential gear DIF. Meanwhile, in a case of operating regenerative braking, rotational torque is transmitted to the motor generator MG1 from the wheels, and alternating-current power is generated on the basis of the supplied rotational torque.

The generated alternating-current power is converted into direct-current power by a power conversion apparatus 200 as described below and is used to charge a battery 136 for high voltage, and charged electric power is used again as traveling energy. In a case where electric power stored in the battery 136 for high voltage is decreased, it is possible to charge the battery 136 by converting rotational energy generated by the engine EGN into alternating-current power with the use of the motor generator MG2 and then converting the alternating-current power into direct-current power with the use of the power conversion apparatus 200. Transmission of mechanical energy to the motor generator MG2 from the engine EGN is performed by the power distribution mechanism TSM.

The power conversion apparatus 200 will be described. A boosting circuit 600 and inverter circuits 140 and 142 are electrically connected via the battery 136 and a direct-current connector 138. A voltage of the battery 136 is increased by the boosting circuit 600. In a circuit 201 to which a boosted voltage is supplied, the inverter circuits 140 and 142 transmit and receive electric power to/from each other. In a case where the motor generator MG1 is operated as a motor, the inverter circuit 140 generates alternating-current power on the basis of direct-current power supplied from the battery 136 via the direct-current connector 138, and supplies the alternating-current power to the motor generator MG1 via an alternating-current terminal 188. A configuration including the motor generator MG1 and the inverter circuit 140 operates as a first motor generator unit.

Similarly, in a case where the motor generator MG2 is operated as a motor, the inverter circuit 142 generates alternating-current power on the basis of direct-current power supplied from the battery 136 via the direct-current connector 138, and supplies the alternating-current power to the motor generator MG2 via an alternating-current terminal 159. A configuration including the motor generator MG2 and the inverter circuit 142 operates as a second motor generator unit.

The first motor generator unit and the second motor generator unit are both operated as motors or as generators in some cases and are differently used in some cases depending on an operation state. It is also possible not to operate one of the motor generator units, i.e., to stop one of the motor generator units. Note that, in this embodiment, the first motor generator unit is operated as a motor unit with electric power of the battery 136, and therefore it is possible to drive a vehicle only with the use of power of the motor generator MG1. Furthermore, in this embodiment, power is generated by operating the first motor generator unit or the second motor generator unit as a generator unit with power of the engine or power from the wheels, and therefore it is possible to charge the battery 136.

Although omitted in FIG. 2, the battery 136 is further used as a power source for driving a motor for an auxiliary machinery. The motor for an auxiliary machinery is, for example, a motor for driving a compressor of an air conditioner or a motor for driving a controlling oil hydraulic pump. Direct-current power is supplied to a power module for an auxiliary machinery from the battery 136, and the power module for an auxiliary machinery generates alternating-current power and supplies the alternating-current power to the motor for an auxiliary machinery. The power module for an auxiliary machinery basically has a circuit configuration and a function similar to those of the inverter circuit 140 and controls a phase and a frequency of an alternating current and electric power to be supplied to the motor for an auxiliary machinery. Note that the power conversion apparatus 200 includes a capacitor module 500 for smoothing direct-current power to be supplied to the inverter circuit 140.

The power conversion apparatus 200 includes a communication connector 21 for receiving a command from an upper control apparatus or transmitting data indicating a state to the upper control apparatus. The power conversion apparatus 200 calculates control amounts of the motor generator MG1, the motor generator MG2, and the motor for an auxiliary machinery in a control circuit 172 in response to a command from the connector 21, and further calculates whether the motor generators are operated as motors or as generators. The power conversion apparatus 200 generates a control pulse on the basis of a result of this calculation and supplies the control pulse to a driver circuit 174 and a driver circuit of the module for an auxiliary machinery. The driver circuit 174 generates a driving pulse for controlling the inverter circuits 140 and 142 on the basis of the supplied control pulse.

Configurations of electric circuits of the inverter circuits 140 and 142 in the circuit 201 to which a boosted voltage is supplied will be described with reference to FIG. 3. Note that circuit configurations and operations of the two inverter circuits 140 and 142 are extremely similar, and there is a control method for operating only the motor generator MG1 as a motor and also as a generator, and therefore the inverter circuit 140 will be mainly described below. Hereinafter, an insulated gate type bipolar transistor is used as a semiconductor element and is abbreviated as "IGBT".

An IGBT 328 and a diode 156 of an upper arm and an IGBT 330 and a diode 166 of a lower arm constitute a vertical arm series circuit 150. The inverter circuit 140 includes three vertical arm series circuits 150 corresponding to three phases of a U phase, a V phase, and a W phase of alternating-current power to be outputted.

In this embodiment, those three phases correspond to phase windings of three phases of an armature winding of the motor generator MG1. Each of the vertical arm series circuits 150 for the three phases outputs an alternating current from an intermediate electrode 169 positioned in a middle of the series circuit. The intermediate electrode 169 is connected via the alternating-current terminal alternating-current terminal 188 to an alternating-current busbar 802 that is an alternating-current power line to the motor generator MG1.

A collector electrode 153 of the IGBT 328 of the upper arm is electrically connected to a capacitor terminal 506 on a positive-electrode side of the capacitor module 500 via a positive electrode terminal 157. Further, an emitter electrode of the IGBT 330 of the lower arm is electrically connected to a capacitor terminal 504 on a negative-electrode side of the capacitor module 500 via a negative electrode terminal 158.

As described above, the control circuit 172 receives a control command from the upper control apparatus via the connector 21, and, in response to the control command, generates a control pulse that is a control signal for controlling the IGBT 328 constituting the upper arm and the IGBT 330 constituting the lower arm of each of the vertical arm series circuits 150 for the respective phases included in the inverter circuit 140, and supplies the control pulse to the driver circuit 174.

In response to the control pulse, the driver circuit 174 supplies, to the IGBTs 328 and the IGBTs 330 for the respective phases, a driving pulse for controlling the IGBTs 328 constituting the upper arms and the IGBTs 330 constituting the lower arms of the vertical arm series circuits 150 for the respective phases. The IGBTs 328 and the IGBTs 330 perform a conduction or interruption operation in response to the driving pulse from the driver circuit 174, thereby converting direct-current power supplied from the battery 136 into three-phase alternating-current power. The converted electric power is supplied to the motor generator MG1.

Each of the IGBTs 328 of the upper arms includes the collector electrode 153, a signal emitter electrode 155, and a gate electrode 154. Further, each of the IGBTs 330 of the lower arms includes a collector electrode 163, a signal emitter electrode 165, and a gate electrode 164. The diode 156 of the upper arm is electrically connected between the collector electrode 153 and the emitter electrode 155. The diode 166 is electrically connected between the collector electrode 163 and the emitter electrode 165.

As a switching power semiconductor element, a metal-oxide semiconductor field-effect transistor (hereinafter, abbreviated as "MOSFET") may be used. In this case, the diode 156 and the diode 166 are not needed. As the switching power semiconductor element, the IGBT is suitable in a case where a direct-current voltage is relatively higher and the MOSFET is suitable in a case where a direct-current voltage is relatively low.

The capacitor module 500 includes the plurality of positive-electrode side capacitor terminals 506, the plurality of negative-electrode side capacitor terminals 504, a positive-electrode side power source terminal 509, and a negative-electrode side power source terminal 508. Direct-current power having a high voltage from the battery 136 is supplied to the positive-electrode side power source terminal 509 and the negative-electrode side power source terminal 508 via the direct-current connector 138, and is supplied to the inverter circuit 140 from the capacitor terminal 506 on the positive-electrode side of the capacitor module 500 and the capacitor terminal 504 on the negative-electrode side thereof.

Meanwhile, direct-current power converted from alternating-current power by the inverter circuit 140 and the inverter circuit 142 is supplied to the capacitor module 500 from the positive-electrode side capacitor terminals 506 and the negative-electrode side capacitor terminals 504, is supplied to the battery 136 from the positive-electrode side power source terminal 509 and the negative-electrode side power source terminal 508 via the direct-current connector 138, and is stored in the battery 136.

The control circuit 172 includes a microcomputer for calculating switching timings of the IGBTs 328 and the IGBTs 330. Input information to the microcomputer is a target torque value required for the motor generator MG1, current values supplied to the motor generator MG1 from the vertical arm series circuits 150, and a position of a magnetic pole of a rotor of the motor generator MG1.

The target torque value is based on a command signal outputted from an upper control apparatus (not shown). The current values are detected on the basis of a detection signal from a current sensor 180. The position of the magnetic pole is detected on the basis of a detection signal outputted from a rotary magnetic pole sensor (not shown) such as a resolver provided in the motor generator MG1. This embodiment cites an example where the current sensor 180 detects the current values of the three phases, however, may detect current values of two phases and obtain currents of the three phases by calculation.

The microcomputer in the control circuit 172 calculates current command values in a d axis and a q axis of the motor generator MG1 on the basis of the target torque value and calculates voltage command values in the d axis and the q axis on the basis of a difference between the calculated current command values in the d axis and the q axis and detected current values in the d axis and the q axis. Then, the microcomputer converts the calculated voltage command values in the d axis and the q axis into voltage command values for the U phase, the V phase, and the W phase on the basis of the detected position of the magnetic pole. Then, the microcomputer generates a pulse modulated wave on the basis of comparison between a fundamental wave (sine wave) and a carrier wave (triangular wave) based on the voltage command values for the U phase, the V phase, and the W phase, and outputs the generated modulated wave to the driver circuit 174 as a PWM (pulse width modulation) signal.

In a case where the driver circuit 174 drives the lower arms, the driver circuit 174 outputs, to corresponding gate electrodes of the IGBTs 330 of the lower arms, driving signals obtained by amplifying the PWM signal. In a case where the driver circuit 174 drives the upper arms, the driver circuit 174 shifts a level of a reference potential of the PWM signal to a level of a reference potential of the upper arms, amplifies the PWM signal, and then outputs the amplified PWM signal as driving signals to corresponding gate electrodes of the IGBTs 328 of the upper arms.

The microcomputer in the control circuit 172 protects the vertical arm series circuits 150 by sensing abnormalities (such as overcurrent, overvoltage, and overtemperature). Therefore, sensing information is inputted to the control circuit 172. For example, information on current flown to the emitter electrodes of the IGBTs 328 and the IGBTs 330 is inputted to corresponding driving parts (ICs) from the signal emitter electrodes 155 and the signal emitter electrodes 165 of the arms. Thus, the driving parts (ICs) sense an overcurrent and, in a case where the overcurrent is sensed, stop switching operations of the corresponding IGBT 328 and the corresponding IGBT 330, thereby protecting the corresponding IGBT 328 and the corresponding IGBT 330 from the overcurrent.

Information on a temperature of each of the vertical arm series circuits 150 is inputted to the microcomputer from a temperature sensor (not shown) provided in each vertical arm series circuit 150. Information on a voltage on a direct-current positive-electrode side of the vertical arm series circuits 150 is also inputted to the microcomputer. The microcomputer senses an overtemperature and an overvoltage on the basis of the above information and, in a case where the overtemperature or the overvoltage is sensed, stops all switching operations of the IGBTs 328 and the IGBTs 330.

Figure 1:
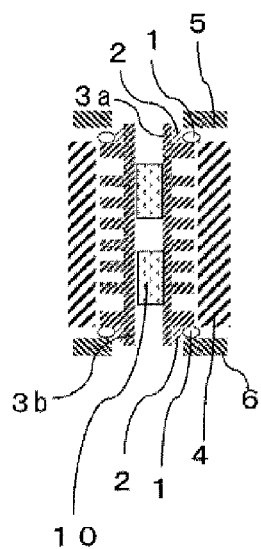
FIG. 1A-1C' are sectional views schematically illustrating sealing structures of the conventional arts described in PTLs 1 to 3.
Figure 1:
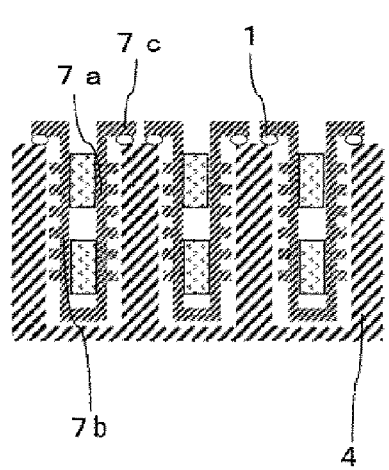
Figure 1:
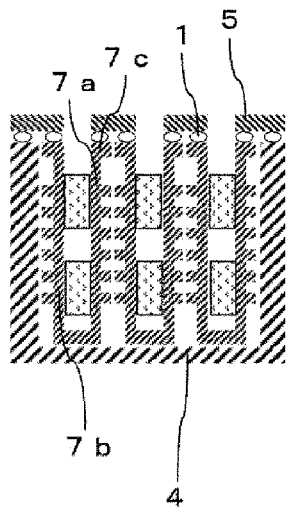
Figure 1:
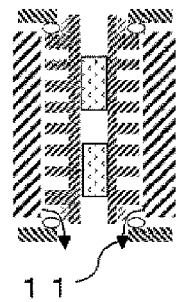
Figure 1:
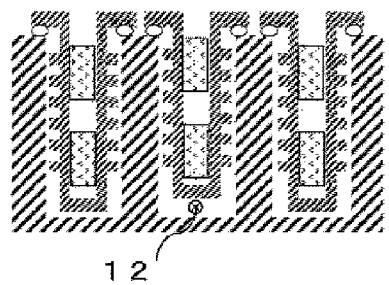
Figure 1:
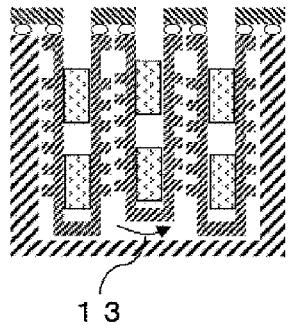

The power conversion apparatus 200 in this embodiment will be described with reference to FIG. 4 to FIG. 9. An example where only the motor generator MG1 is operated as a motor and also as a generator, i.e., only the inverter circuit 140 is included in the power conversion apparatus 200 will be described, however, it is also possible to add the inverter circuit 142 as shown in FIG. 1 and FIG. 2.

Figure 4:
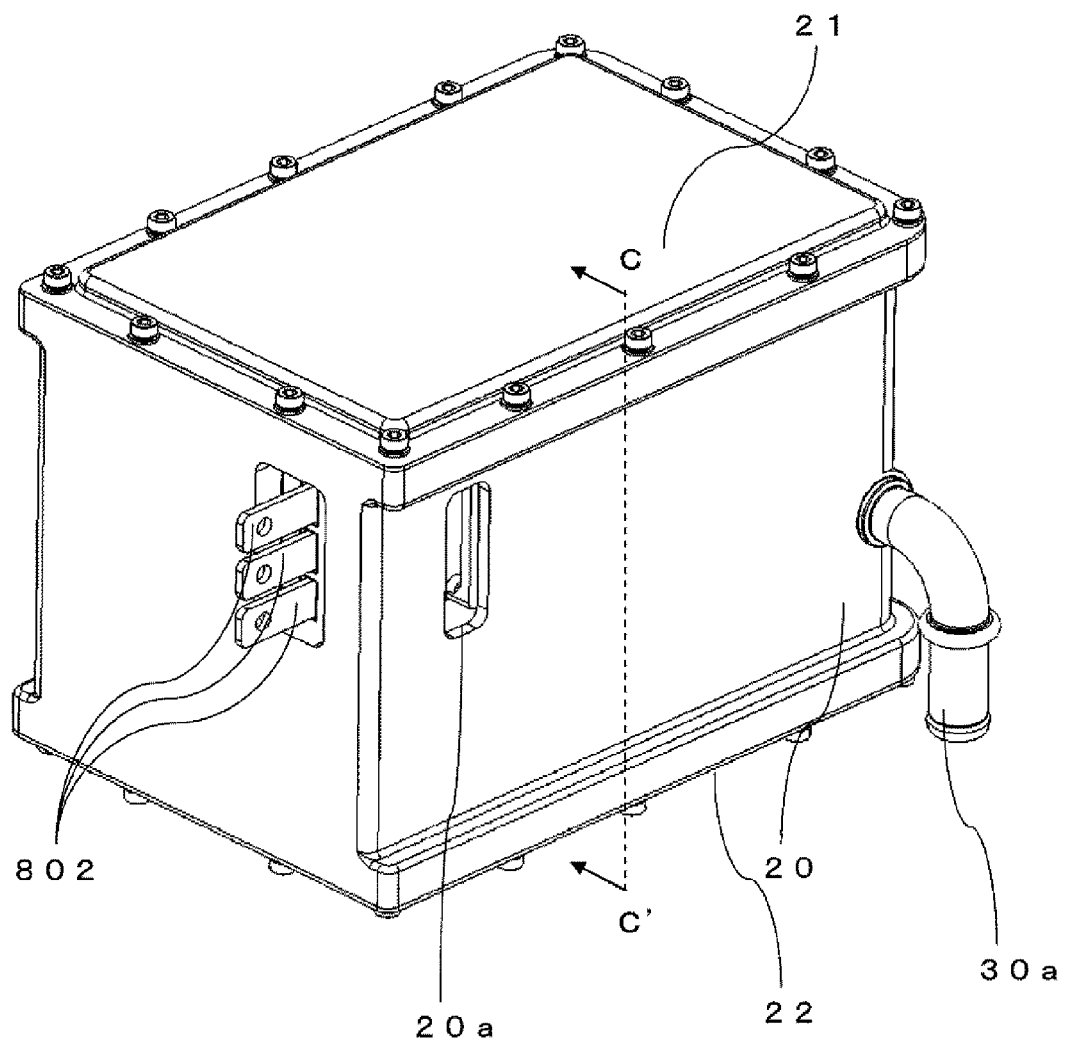
FIG. 4 is a perspective view of a power conversion apparatus 200.

FIG. 4 is a perspective view of the power conversion apparatus 200. The power conversion apparatus 200 includes a housing 20. A housing upper cover 21 is placed on an upper surface of the housing 20. A housing lower cover 22 is placed on a lower surface of the housing 20. The housing upper cover 21 and the housing lower cover 22 are fixed to the housing 20 with screws.

A housing opening 20a is provided in a side surface of the housing 20. The housing opening 20a is provided for connecting a terminal of the power semiconductor module to outside. Another opening is provided in the side surface of the housing 20, and the alternating-current busbar 802 is protruded through the opening. An opening 20e is provided in one surface of the side surface of the housing 20, the one surface facing to the surface in which the housing opening 20a is provided (see FIG. 5). A coolant inlet pipe 30a and a coolant outlet pipe 30b (see FIG. 7) are provided to the housing 20.

A structure of the power conversion apparatus 200 of this embodiment has a substantially rectangular shape seen from a plan view, and therefore it is easy to attach the power conversion apparatus 200 to a vehicle or a motor generator.

Figure 5:
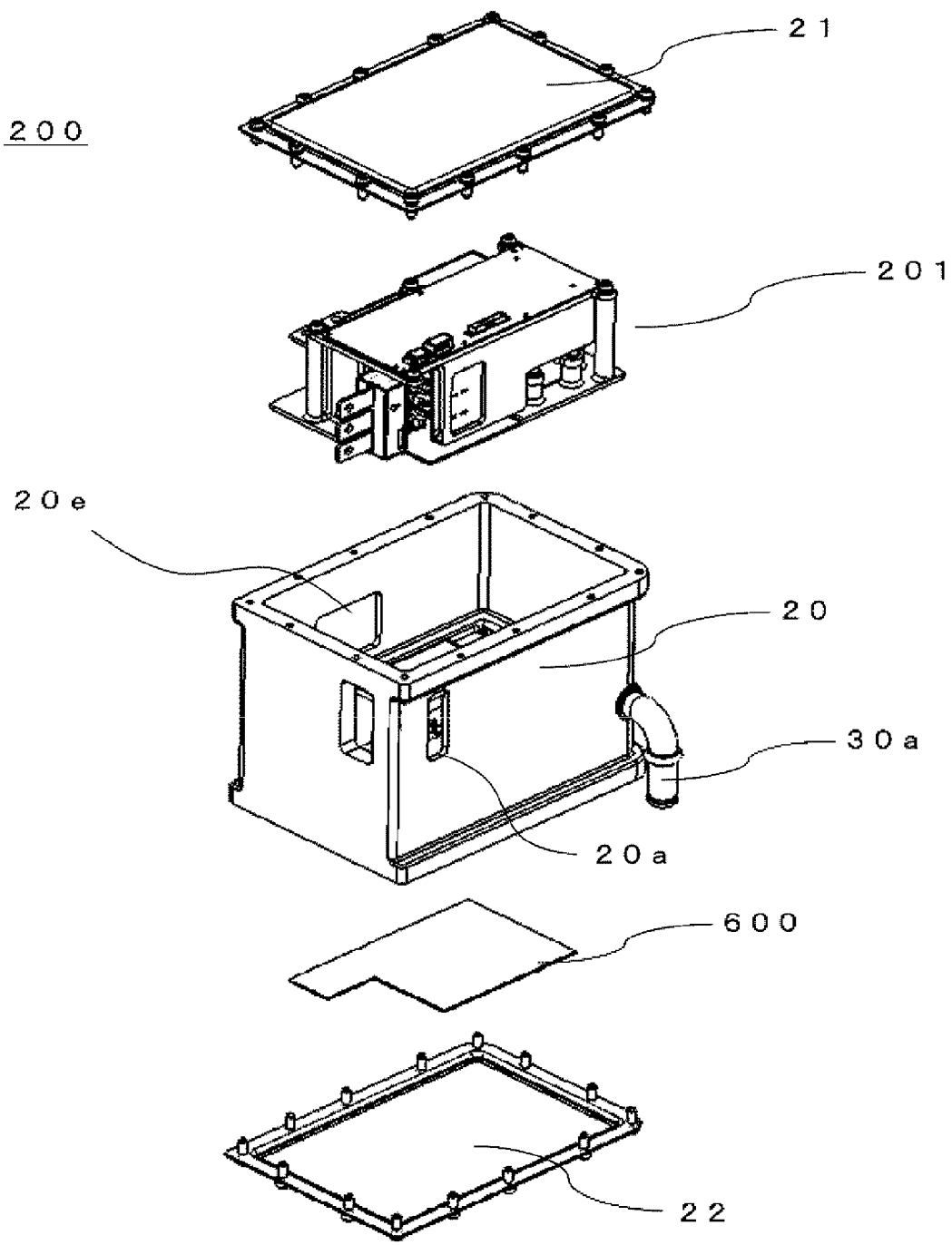
FIG. 5 is an exploded perspective view of the power conversion apparatus 200.

FIG. 5 is an exploded perspective view of the power conversion apparatus 200. The power conversion apparatus 200 includes the boosting circuit 600 and the circuit 201 to which a boosted voltage is supplied. The housing 20 houses the boosting circuit 600 and the circuit 201 to which a boosted voltage is supplied. A flow channel through which a coolant flows is integrally provided with the housing 20, as described below. The circuit 201 to which a boosted voltage is supplied is placed on a side of the housing upper cover 21 and the boosting circuit 600 is placed on a side of the housing lower cover 22 with respect to the flow channel.

Figure 6:
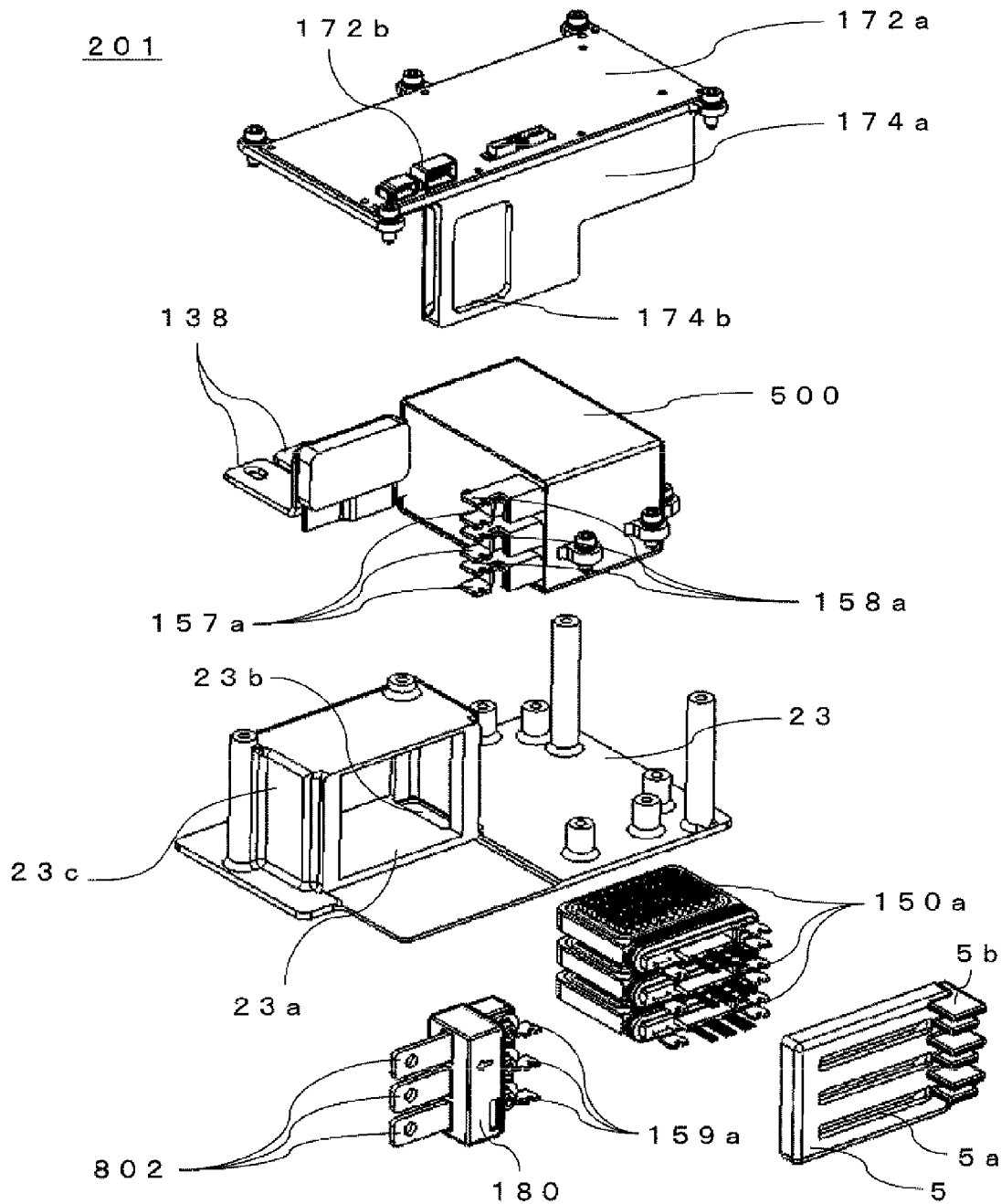
FIG. 6 is an exploded perspective view of a module of a circuit 201 to which a boosted voltage is supplied.

FIG. 6 is an exploded perspective view of the circuit 201, illustrated in FIG. 5, to which a boosted voltage is supplied. The circuit 201 to which a boosted voltage is supplied includes a driver circuit substrate 174a, a control circuit substrate 172a, the capacitor module 500, and power semiconductor modules 150a. The driver circuit 174 of FIG. 2 is mounted on the driver circuit substrate 174a. The control circuit 172 of FIG. 2 is mounted on the control circuit substrate 172a.

A connector 172b is provided on the control circuit substrate 172a. The connector 172b is connected to an xternal control apparatus, and transmits signals between the control circuit 172 provided on the control circuit substrate 172a and the external control apparatus such as an upper control apparatus.

An opening 174b is provided in the driver circuit substrate 174a. The opening 174b as well as the housing opening 20a is provided to connect the terminal of the power semiconductor module to outside.

The driver circuit substrate 174a is placed so that a main surface of the driver circuit substrate 174a is orthogonal to a main surface of the control circuit substrate 172a. The driver circuit substrate 174a and the control circuit substrate 172a are electrically connected by a flexible cable. With such a configuration, it is possible to achieve mounting at a high density in a limited space of the power conversion apparatus, and therefore a size of the whole power conversion apparatus can be reduced. Further, by using the flexible cable, it is possible to achieve electrical connection with an excellent vibration resistance.

The capacitor module 500 includes the direct-current connectors 138, capacitor-side positive electrode busbars 157a, and capacitor-side negative electrode busbars 158a. The direct-current connectors 138 are protruded to outside of the power conversion apparatus 200 through the opening 20e. The capacitor-side positive electrode busbars 157a and the capacitor-side negative electrode busbars 158a are connected to the power semiconductor modules 150a. In this embodiment, because three power semiconductor modules are provided, three sets of the capacitor-side positive electrode busbars 157a and the capacitor-side negative electrode busbars 158a are provided.

A circuit module holding member 23 to which a boosted voltage is supplied is a plate-like holding member for providing the driver circuit substrate 174a, the control circuit substrate 172a, the capacitor module 500, and the power semiconductor module 150a.

On one side of a surface of the circuit module holding member 23 to which a boosted voltage is supplied, a power semiconductor module accommodating part 23c is provided. The power semiconductor module accommodating part 23c has a substantially rectangular parallelepiped.

In one side surface of the power semiconductor module accommodating part 23c, a module insertion port 23a is provided. The power semiconductor modules 150a are inserted into the power semiconductor module accommodating part 23c through the module insertion port 23a. The power semiconductor modules 150a of this embodiment have a flat shape and will be described below with reference to FIG. 7. The three power semiconductor modules 150a are piled so as to be in parallel to a main surface of the circuit module holding member 23 to which a boosted voltage is supplied.

In this example, the module insertion port 23a is a single large opening in order to simplify the flow channel, and therefore the three power semiconductor modules 150a are inserted while being close to one another.

In the power semiconductor module accommodating part 23c, coolant introduction ports 23b are provided. The coolant introduction ports 23b are openings that pass through the circuit module holding member 23 to which a boosted voltage is supplied. Although not shown in FIG. 6, the two coolant introduction ports 23b are provided, i.e., an opening for introducing a coolant into the power semiconductor module accommodating part 23c and an opening for discharging the coolant to outside of the power semiconductor module accommodating part 23c are provided. That is, the power semiconductor module accommodating part 23c has a coolant flow channel for cooling the power semiconductor modules 150a.

An opening of the module insertion port 23a is covered by the cover 5. The cover 5 has cover openings 5a for allowing the terminals of the power semiconductor modules 150a to pass therethrough, protrusion portions 5b, and recessed portions 5c.

The power semiconductor modules 150a are connected to a part in which output-side alternating-current busbars 159a, the current sensor 180, and the alternating-current busbars 802 are integrally provided. Alternating-current power converted from direct-current power by the power semiconductor modules is outputted by the alternating-current busbars 802.

The capacitor module 500 is placed on a surface of the circuit module holding member 23 to which a boosted voltage is supplied. The capacitor module 500 is placed on a side portion of the power semiconductor module accommodating part 23c. The control circuit substrate 172a is placed on the capacitor module 500 and the power semiconductor module accommodating part 23c so as to mount on the capacitor module 500 and the power semiconductor module accommodating part 23c.

Note that the capacitor-side positive electrode busbars 157a and the capacitor-side negative electrode busbars 158a generate heat in a case where a large current is flown, and therefore it is necessary to prevent heat from intruding into the power semiconductor modules 150a. In view of this, by providing the protrusion portions 5b in the cover 5 for fixing the power semiconductor modules and bringing the protrusion portions 5b into thermal contact with the busbars, it is possible to reduce intrusion of heat into the power semiconductor modules 150a. In a case where the cover 5 is made from metal material, the protrusion portions 5b are brought into thermal contact via an insulating layer, however, as material of the cover, insulating material such as resin can be also used.

As described above, the circuit 201 to which a boosted voltage is supplied is structured as an independent module by mounting the whole circuit 201 (power semiconductor module 150a, capacitor module 500, etc.) to which a boosted voltage is supplied on the circuit module holding member 23 to which a boosted voltage is supplied. Thus, the module constituting the circuit 201 to which a boosted voltage is supplied, a module constituting the boosting circuit 600, the housing upper cover 21, and the housing lower cover 22 can be stacked and therefore can be easily produced.

Figure 7:
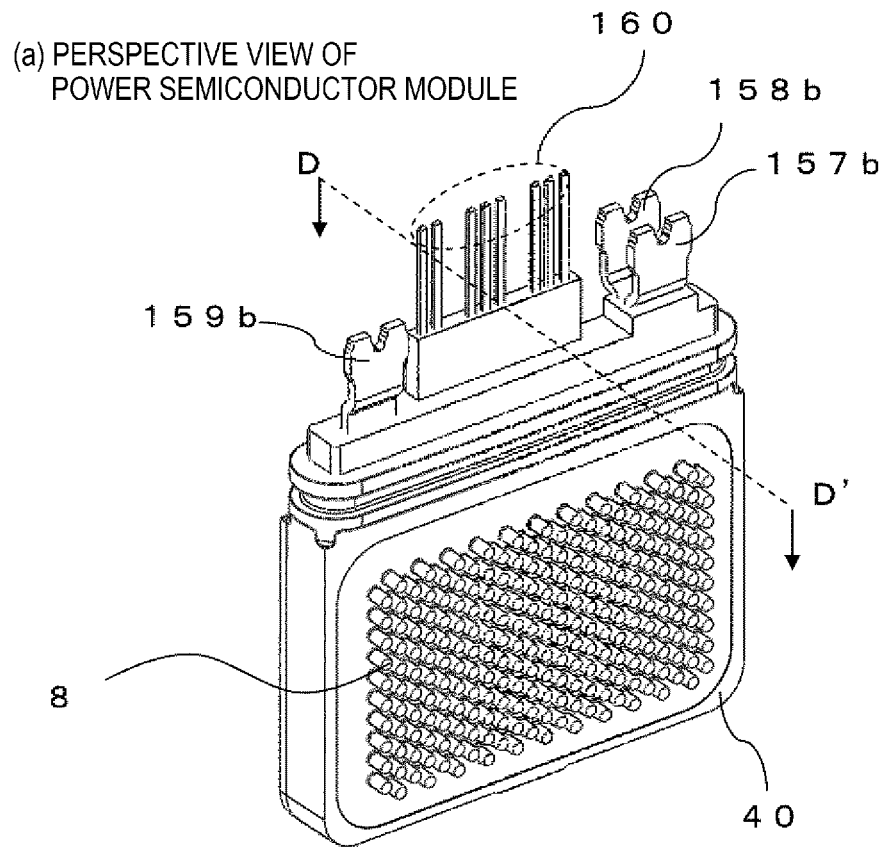
FIGS. 7A and 7B are perspective views and sectional views of a power semiconductor module.
Figure 7:
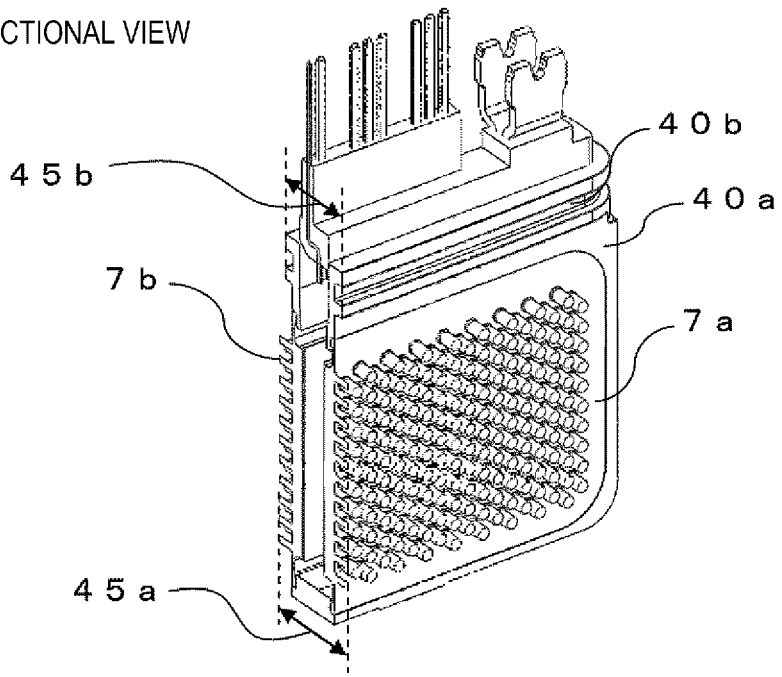

FIG. 7 is a perspective view and a sectional view of the power semiconductor module 150a. The power semiconductor module 150a includes a metal case 40 having a flat shape. A heat sink 7a is subjected to metallic bonding onto one surface of the metal case 40 and a heat sink 7b is subjected to metallic bonding onto the other surface thereof. Cooling fins 8 are provided on the heat sinks 7a and 7b of the metal case 40.

The metal case 40 includes a part 40a for holding the heat sinks 7a and 7b and a sealing material holding portion 40b. In a case where, for example, an 0 ring is used as sealing material, a groove for the O ring is processed in the sealing material holding portion 40b. The sealing material holding portion 40b has a curved surface without edges in order to prevent damage to the O ring.

Herein, a distance between tips of the cooling fins 8 provided on the heat sink 7a and tips of the cooling fins 8 provided on the heat sink 7b is defined as a heat sink thickness 45a. Further, a thickness of the sealing material holding portion 40b is defined as a sealing material holding portion thickness 45b. In this case, the sealing material holding portion thickness 45b is provided to be smaller than the heat sink thickness 45a.

Figure 3:
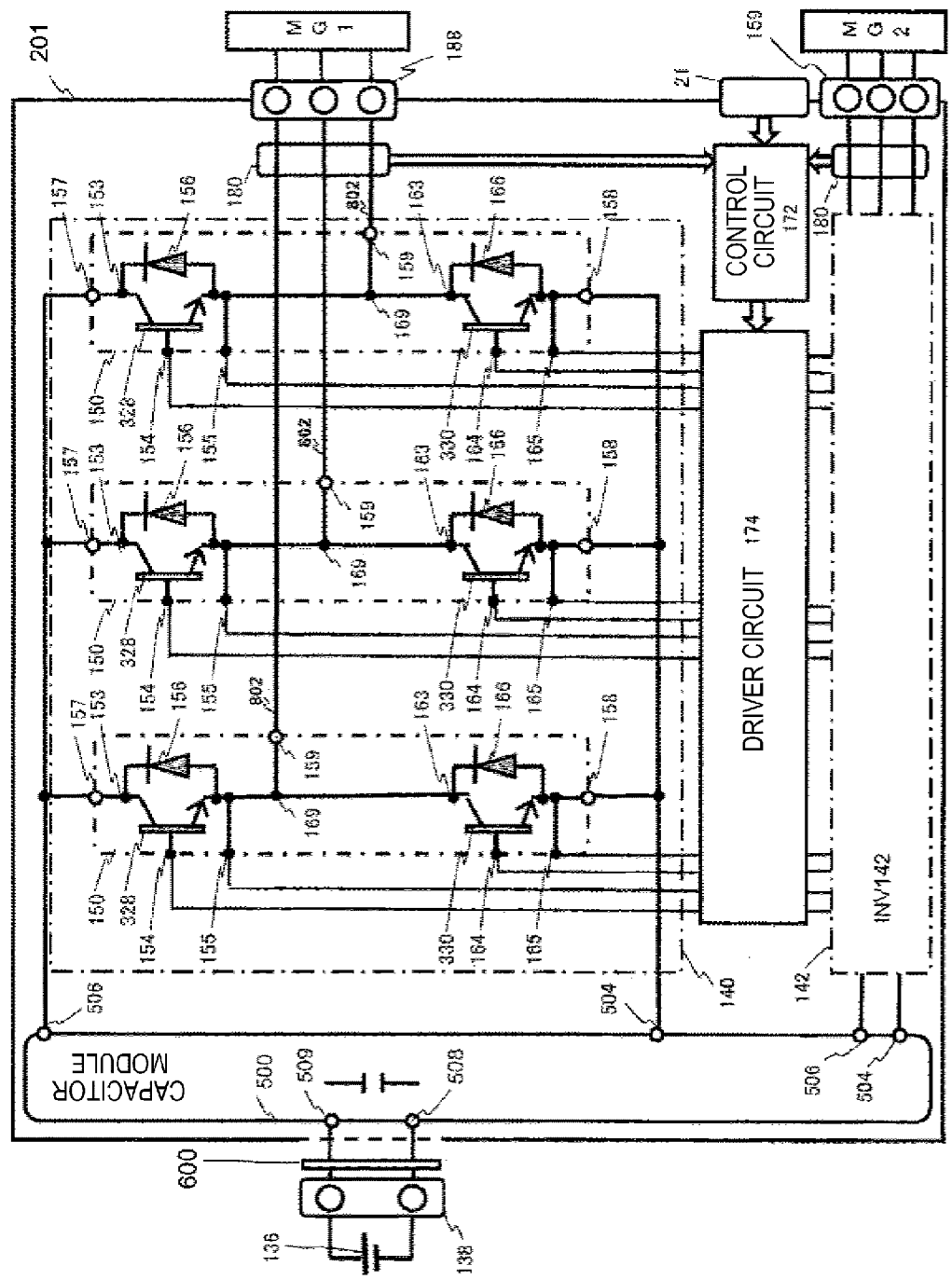
FIG. 3 is an electric circuit configuration diagram of inverter circuits 140 and 142.

The power semiconductor module 150a accommodates the vertical arm series circuits 150 illustrated in FIG. 3 in the metal case 40. A control pin, a signal pin, a temperature output pin, etc. 160, the positive electrode busbar 157a, a negative electrode busbar 158b, and an alternating-current busbar 159b are protruded from the metal case 40. The control pin, the signal pin, the temperature output pin, etc. 160 are connected to the control circuit substrate 172 via the driver circuit substrate 174a, and receive and output a gate signal, an emitter sense signal, and information on the temperature sensor included in the power semiconductor. The positive electrode busbar 157a is connected to the capacitor-side positive electrode busbar 157a. The negative electrode busbar 158b is connected to the capacitor-side negative electrode busbar 158a. The alternating-current busbar 159b is connected to the output-side alternating-current busbar 159a. As described above, in order to easily connect the control pin, the signal pin, the temperature output pin, etc. 160 to outside, the opening 174b is provided in the driver circuit substrate 174a and the housing opening 20a is provided in the housing 20.

In order to reduce costs, the metal case 40 may be an integrated container produced by molding a can shape and forming a heat-radiation fin part 7 and the casing portion 40a by forging.

Figure 8:
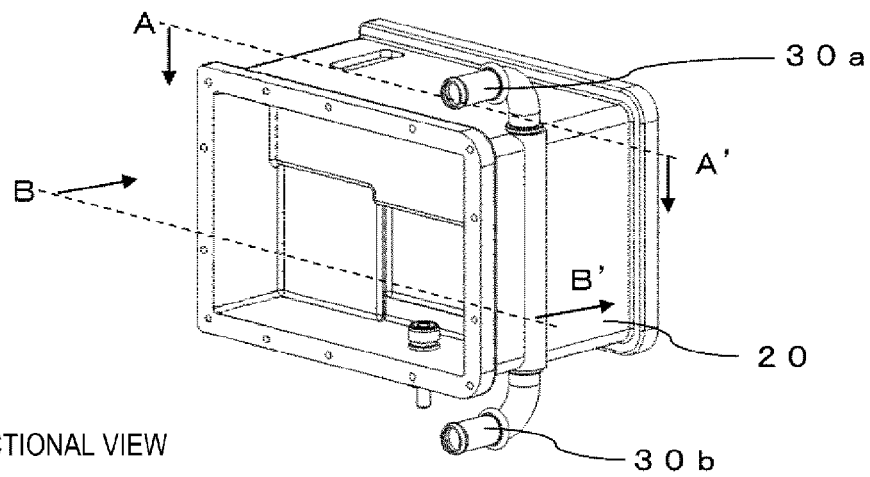
FIG. 8A-8C are sets of constituent members of a flow channel.
Figure 8:
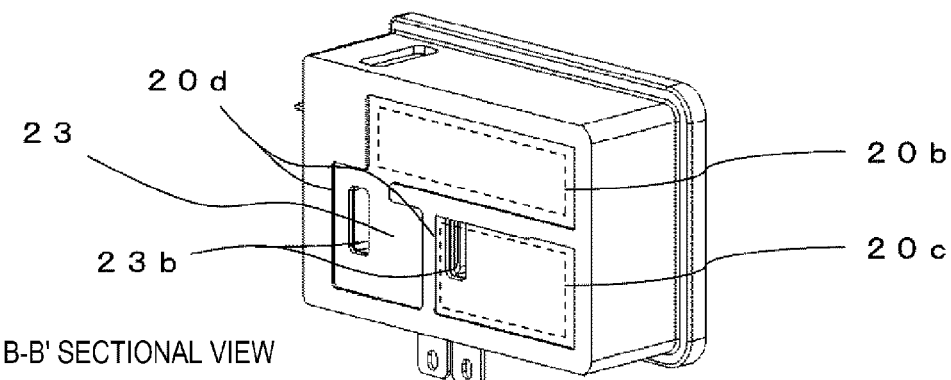
Figure 8:
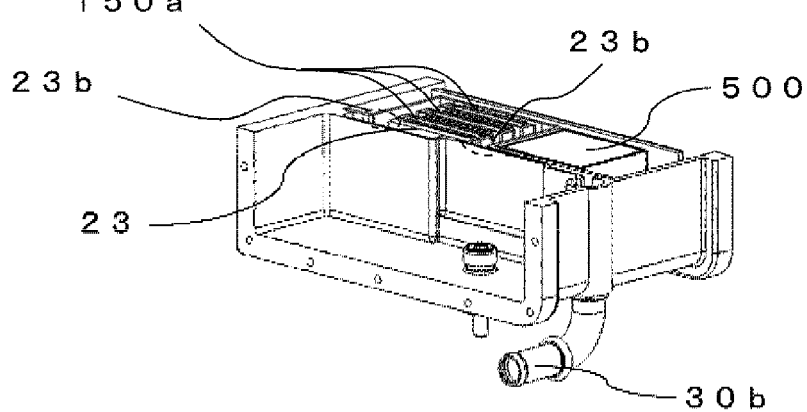

FIG. 8 is a perspective view of a set of constituent members of the flow channel. FIG. 8(*a*) is a perspective view, seen from a lower surface, of the power conversion apparatus 200 from which the housing lower cover 22 and the boosting circuit 600 are removed. In the power conversion apparatus 200 of this embodiment, a coolant flown from the coolant inlet pipe 30a is flown through a first flow channel 20b illustrated in FIG. 8. The first flow channel 20b is a space that is obtained by covering an in-housing opening 20d integrally provided with the housing 20 with the use of the circuit module holding member 23 to which a boosted voltage is supplied (see FIG. 9).

Subsequently, the coolant passes through the coolant introduction port 23b of the power semiconductor module accommodating part 23c, and is introduced into the power semiconductor module accommodating part 23c. The coolant cools the power semiconductor module 150a in the power semiconductor module accommodating part 23c, and is discharged from the power semiconductor module accommodating part 23c through the other coolant introduction port 23b. Thereafter, the coolant is flown through a second flow channel 20c, and is discharged from the coolant outlet pipe 30b.

The coolant flown through the first flow channel 20b and the second flow channel 20c also cools, via the circuit module holding member 23 to which a boosted voltage is supplied, the capacitor module 500 placed to be opposite to the circuit module holding member 23 to which a boosted voltage is supplied.

Figure 9:
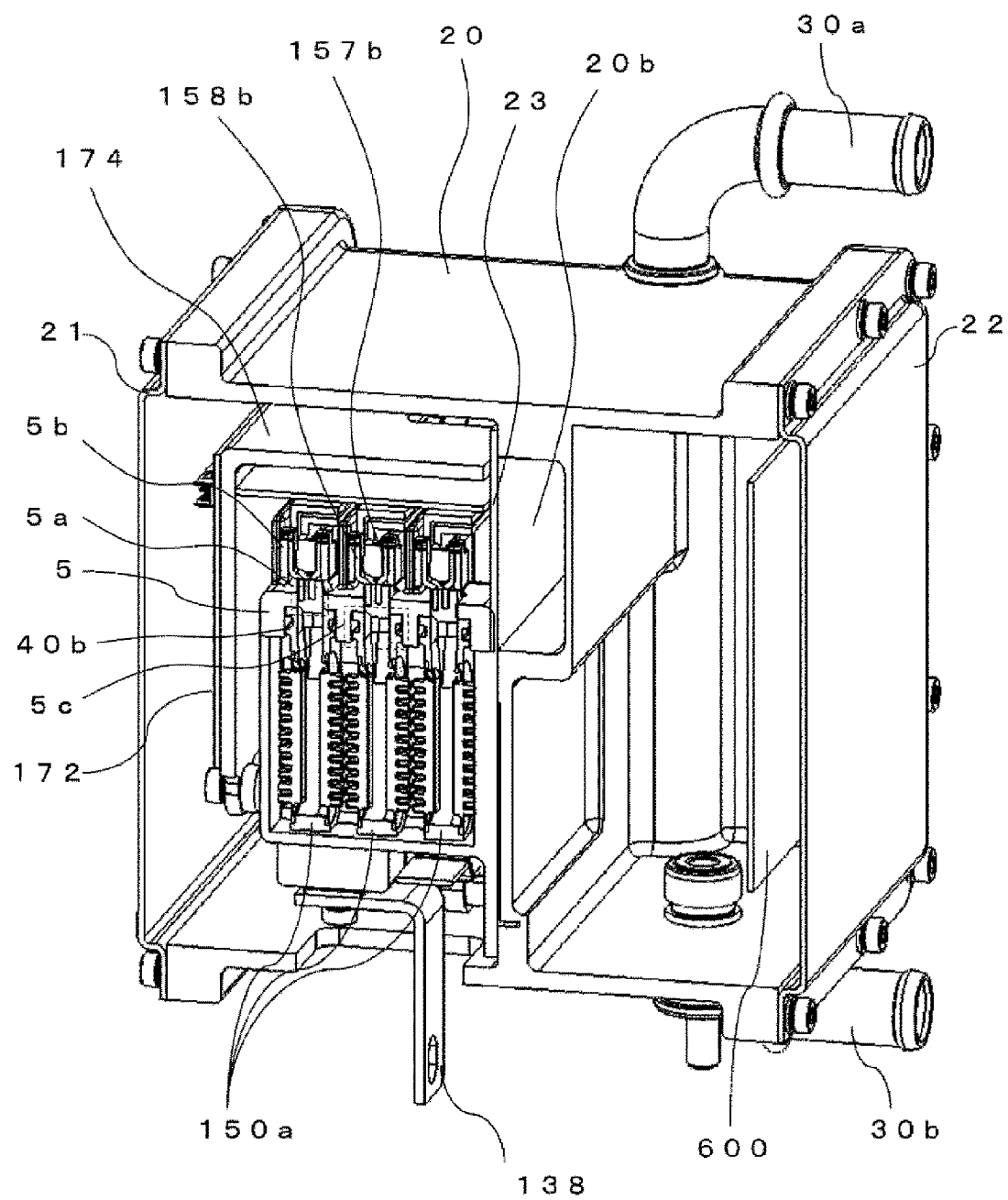
FIG. 9 is a sectional view taken along the line C-C' of FIG. 4.

FIG. 9 is a sectional view taken along the line C-C' of FIG. 4. As illustrated in FIG. 9, the circuit module holding member 23 to which a boosted voltage is supplied is placed on one side and the boosting circuit 600 is placed on the other side with respect to the coolant flow channel. As described above, the coolant flow channel is provided by covering the in-housing opening 20d integrally provided with the housing 20 with the use of the circuit module holding member 23 to which a boosted voltage is supplied. In other words, the housing 20 of the power conversion apparatus 200 according to this embodiment functions not only as a structural member for holding the circuit module holding member 23 to which a boosted voltage is supplied and on which the power semiconductor module, the capacitor module, and the like are mounted, but also as a flow channel forming body for cooling those members. With this configuration, it is possible to efficiently cool the power semiconductor module 150 having a large heating value, the capacitor module 500, and the boosting circuit 600.

The driver circuit substrate 174a and the control circuit substrate 172a are thermally connected to the housing 20 made from metal and the circuit module holding member 23 to which a boosted voltage is supplied, and heat is released to a cooling medium in the flow channel via the metal member having high thermal conductivity.

As illustrated in FIG. 9, the recessed portions 5c are provided in the cover 5 in accordance with placement with the power semiconductor modules 150a. The openings 5a are provided in bottom surface portions of the recessed portions 5c, and a module-side positive electrode busbars 157b and the module-side negative electrode busbars 158b that are terminals of the power semiconductor modules 150a pass through the openings 5a. The sealing material holding portion 40b of each of the power semiconductor modules 150a and an inner wall of each of the recessed portions 5c of the cover 5 form an airtight structure. That is, the recessed portion 5c of the cover 5 is provided to be fitted into the sealing material holding portion 40b of the power semiconductor module 150a. Further, sealing material is provided between the sealing material holding portion 40b and a recessed portion c of the cover 5. Therefore, outflow of a coolant flown through the power semiconductor module accommodating part 23c to outside is prevented and inflow of the coolant into the power semiconductor module is prevented.

Therefore, for example, in a case where the cover 5 is fastened to the housing with the use of bolts, the sealing material is pressed on a side surface regardless of a pressing force of the bolts, and therefore it is unnecessary to provide a bolt in the flow channel in the periphery of the power semiconductor module. This makes it possible to reduce the number of bolts. Further, even in a case where a size in a vertical direction is small because of production variation of power semiconductor modules, the sealing material is always pressed on the side surface, and therefore it is possible to reduce occurrence of fluid leakage to outside and bypass flow in a local space inside the module. This improves sealing reliability. By providing the recessed portions in the cover, it is possible to avoid to perform sealing on a side surface of a thick plate. In a case where the thick plate is used, it is difficult to reduce a weight, and there is also a problem in a quake-resistant structure because a center of gravity thereof becomes high. By providing the recessed portions, it is possible to apply rigidity only to a necessary part and to reduce the weight.

Further, in this embodiment, the three power semiconductor modules 150a are placed to be close to one another in the power semiconductor module accommodating part 23c. In a coolant flow channel provided by stacking the power semiconductor modules 150a, in order to prevent bypass flow of a coolant, it is preferable to decrease a space between the cooling fins 8 of a power semiconductor module and the cooling fins 8 of another power semiconductor module as much as possible.

The recessed portions 5c are provided in the cover 5 to correspond to the power semiconductor modules 150a. Therefore, the three recessed portions 5c are provided to be adjacent to one another. In order to apply rigidity to the cover 5 and also to obtain airtightness, the recessed portions 5c adjacent to one another need to have appropriate distances.

Therefore, in this embodiment, as illustrated in FIG. 7, the sealing material holding portion 40b is provided so that the sealing material holding portion thickness 45b is smaller than the heat sink thickness 45a. Therefore, it is possible to reduce a size of the power module accommodating part 23c without deteriorating properties such as prevention of bypass flow and obtaining of airtightness, and such reduction in size eventually contributes to reduce the size of the whole power conversion apparatus 200.

In the above embodiment, a shape of the fins of the heat sink 7 is a pin fin, however, may be, for example, a straight fin or a corrugated fin.

The above embodiment has described an example of an in-vehicle power conversion apparatus provided in an electric vehicle and a hybrid electric vehicle, however, the invention can be similarly applied as long as the power conversion apparatus has a cooling structure in which a power module is immersed in a cooling medium.

Note that, in the above example, the three power semiconductor modules 150a are placed in parallel, however, two-branched flow channels can be achieved by placing flow channels in series instead of achieving four-branched flow channels by placing the flow channels in parallel. By decreasing the number of branches in a system that can even allow a large pressure loss, a flow rate per module is increased and thermal conductivity becomes large, and therefore it is possible to improve coolability.

In the above example, the three power semiconductor modules 150a are inserted while being close to one another and being adjacent to one another, however, a wall of a holding member for providing a power semiconductor module accommodating space may be interposed between a power semiconductor module and another power semiconductor module. By interposing the wall between the power semiconductor module and the another power semiconductor module, it is unnecessary to share the flow channel of the heat sink part of the adjacent power semiconductor modules 150a. Therefore, sectional areas of the branched flow channels become equal and variation of flow distribution to the branched flow channels is reduced. Thus, uniform cooling can be easily performed.

In the above example, all the main terminals (positive electrode busbar 157b, negative electrode busbar 158b, and alternating-current busbar 159b) and the control pin, the signal pin, the temperature output pin, etc. 160 are taken out from one surface, however, the control pin, the signal pin, the temperature output pin, etc. 160 may be taken out from a surface opposite to a surface from which the main terminals are taken out. With this, it is possible to separate weak current system pins from strong current system main terminals, and therefore it is possible to reduce noises of signals. In a case where a plurality of modules are mounted, occurrence of fluid leakage can be prevented by applying a side-surface sealing structure of the invention, even if a size in a vertical direction of only one particular module is varied.

The above embodiments may be solely implemented or combined with each other because effects of the embodiments can be solely obtained or multiplied. Further, the invention is not limited to the above embodiments as long as the invention has features.

REFERENCE SIGNS LIST

1: sealing material
2: ring-like member for holding horizontally separated heat sinks
3a: right-side separated heat sink
3b: left-side separated heat sink
4: wall surface of housing
5: cover
5a: opening
5b: protrusion portion
5c: recessed portion
6: second cover
7: heat sink
7a: right-side integrated heat sink
7b: left-side integrated heat sink
7c: integrated flange
8: cooling fin
11: fluid leakage
12: bypass flow in sheet direction
13: bypass flow
20: housing
20a: housing opening
20b: first flow channel
20c: second flow channel
20d: in-housing opening
20e: housing opening
21: housing upper cover
22: housing lower cover
23: circuit module holding member to which a boosted voltage is supplied
23a: module insertion port
23b: coolant introduction port
23c: power semiconductor module accommodating part
30a: coolant inlet pipe
30b: coolant outlet pipe
40: metal case
40a: heat sink holding portion
40b: sealing material holding portion
45a: heat sink thickness
45b: sealing material holding portion thickness
130: thick part
131: thin part
136: battery
138: direct-current connector
140, 142: inverter circuit
144: heat-radiation fin group
150: vertical arm series circuit
150a: 2 in 1 power semiconductor module
153: collector electrode of IGBT of upper arm
154: gate electrode
155: signal emitter electrode
156: diode of upper arm
157: positive electrode terminal
157a: capacitor-side positive electrode busbar
157b: module-side positive electrode busbar
158: negative electrode terminal
158a: capacitor-side negative electrode busbar
158b: module-side negative electrode busbar
159, 188: alternating-current terminal
159a: output-side alternating-current busbar
159b: module-side alternating-current busbar
160: control pin, signal pin, temperature output pin, etc.
163: collector electrode of IGBT of lower arm
164: gate electrode
165: signal emitter electrode
166: diode of lower arm
169: intermediate electrode
172: control circuit
172a: control circuit substrate
172b: connector on control circuit substrate
174: driver circuit
174a: driver circuit substrate
174b: opening
180: current sensor
200: power conversion apparatus
201: circuit to which a boosted voltage is supplied
328: IGBT of upper arm
330: IGBT of lower arm
500: capacitor module
504: negative-electrode side capacitor terminal
506: positive-electrode side capacitor terminal
508: negative-electrode side power source terminal
509: positive-electrode side power source terminal
600: boosting circuit
802: alternating-current busbar

The invention claimed is:

1. A power conversion apparatus, comprising:
a power semiconductor module for converting direct-current power into alternating-current power;
a first flow channel forming body for housing the power semiconductor module; and
a cover for fixing the power semiconductor module to the first flow channel forming body, wherein:
the power semiconductor module includes a power semiconductor element, main terminals electrically connected to the power semiconductor element, and a case for housing the power semiconductor element;

the cover has a recessed portion and an opening provided in a bottom surface portion of the recessed portion;

the power semiconductor module is placed to be fitted into the recessed portion;

the power semiconductor module is fixed to the cover so that the main terminals pass through the opening; and the case and an inner wall of the recessed portion have an airtight structure.

2. The power conversion apparatus according to claim 1, wherein:

the first flow channel forming body includes a power semiconductor module accommodating part;

the power semiconductor module accommodating part has a module insertion port and a coolant introduction port;

the power semiconductor module is accommodated in the power semiconductor module accommodating part through the module insertion port; and the case is directly contacted with a cooling coolant flown from the coolant introduction port.

3. The power conversion apparatus according to claim 1, wherein:

the case has a fin on an outer surface of the case;

the case is such that a thickness of a part in contact with the inner wall of the recessed portion is smaller than a thickness of a part on which the fin is provided, the thickness including a height of the fin.

4. The power conversion apparatus according to claim 1, wherein:

a side surface of the case for housing the power semiconductor element has a curved surface and has a substantially elliptical shape.

5. The power conversion apparatus according to claim 1, further comprising:

a capacitor module for smoothing the direct-current power;

a driver circuit substrate; and a control circuit substrate, wherein the capacitor module, the driver circuit substrate, and the control circuit substrate are provided in the first flow channel forming body.

6. The power conversion apparatus according to claim 1, further comprising:

a capacitor module for smoothing the direct-current power;

a boosting circuit for boosting the direct-current power; and a housing for housing the power semiconductor module, the capacitor module, and the boosting circuit, wherein:

the housing has a second flow channel forming body integrally provided with the housing inside the housing;

the power semiconductor module and the capacitor module are placed on one side of the second flow channel forming body; and the boosting circuit is placed on the other side of the second flow channel forming body.

7. The power conversion apparatus according to claim 1, wherein a conductor plate for connecting the power semiconductor module to another member is closely attached to the case including a protrusion portion.

* * * * *